(12) United States Patent
Jeong et al.

(10) Patent No.: US 12,518,657 B2
(45) Date of Patent: Jan. 6, 2026

(54) DISPLAY DEVICE

(71) Applicant: Samsung Display Co., LTD., Yongin-si (KR)

(72) Inventors: Kwang Jin Jeong, Yongin-si (KR); Sanggil Kwak, Yongin-si (KR); Yeon Tae Kim, Yongin-si (KR); Youngkwan Kim, Yongin-si (KR); Seok Myeong, Yongin-si (KR); Heesun Ahn, Yongin-si (KR); Yujin Lee, Yongin-si (KR); Wongu Cho, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 217 days.

(21) Appl. No.: 18/529,508

(22) Filed: Dec. 5, 2023

(65) Prior Publication Data

US 2024/0242641 A1    Jul. 18, 2024

(30) Foreign Application Priority Data

Jan. 12, 2023    (KR) .................. 10-2023-0004989

(51) Int. Cl.
*G09F 9/30*    (2006.01)

(52) U.S. Cl.
CPC .................. *G09F 9/301* (2013.01)

(58) Field of Classification Search
CPC combination set(s) only.
See application file for complete search history.

(56) References Cited

U.S. PATENT DOCUMENTS

| | | | | |
|---|---|---|---|---|
| 10,714,562 B2* | 7/2020 | Yang | .............. | H10K 59/873 |
| 11,137,635 B2* | 10/2021 | Higano | ............. | G02F 1/133514 |
| 11,398,609 B2* | 7/2022 | Kwon | ................. | H10K 77/111 |
| 11,594,693 B2* | 2/2023 | Kwon | ................. | B32B 38/145 |
| 11,778,756 B2 | 10/2023 | Lee | | |
| 11,963,436 B2* | 4/2024 | Kwon | ............... | H10K 59/8731 |
| 12,117,868 B2* | 10/2024 | Kim | ................. | H10K 59/8722 |
| 2022/0320448 A1* | 10/2022 | Kwon | ................. | H10K 77/111 |
| 2023/0336650 A1* | 10/2023 | Park | ......................... | B32B 7/12 |
| 2023/0397461 A1* | 12/2023 | Kang | ..................... | H10K 59/40 |
| 2024/0242641 A1* | 7/2024 | Jeong | ..................... | G09F 9/301 |
| 2024/0329784 A1* | 10/2024 | Han | ..................... | G06F 3/0412 |
| 2024/0357918 A1* | 10/2024 | Kwon | .................... | B32B 23/00 |
| 2025/0089408 A1* | 3/2025 | Lee | ..................... | H10H 20/856 |
| 2025/0224829 A1* | 7/2025 | Kim | ................... | G06F 3/04166 |

FOREIGN PATENT DOCUMENTS

| | | |
|---|---|---|
| JP | 2022028600 A | 2/2022 |
| KR | 1020180060710 A | 6/2018 |
| KR | 1020220069160 A | 5/2022 |

* cited by examiner

*Primary Examiner* — Lisa Lea-Edmonds
(74) *Attorney, Agent, or Firm* — CANTOR COLBURN LLP

(57) ABSTRACT

A display device includes a base layer defining a first recess in a first curve formation region, defining a second recess in a second curve formation region spaced apart from the first curve formation region, and including a flat region disposed between the first curve formation region and the second curve formation region, a display panel disposed on a first surface of the base layer in a front surface region that is adjacent to the first curve formation region of the base layer, a driver disposed on the first surface of the base layer in a rear surface region that is adjacent to the second curve formation region of the base layer, and a cover layer disposed between the display panel and the driver on the first surface of the base layer.

18 Claims, 11 Drawing Sheets

FIG. 5
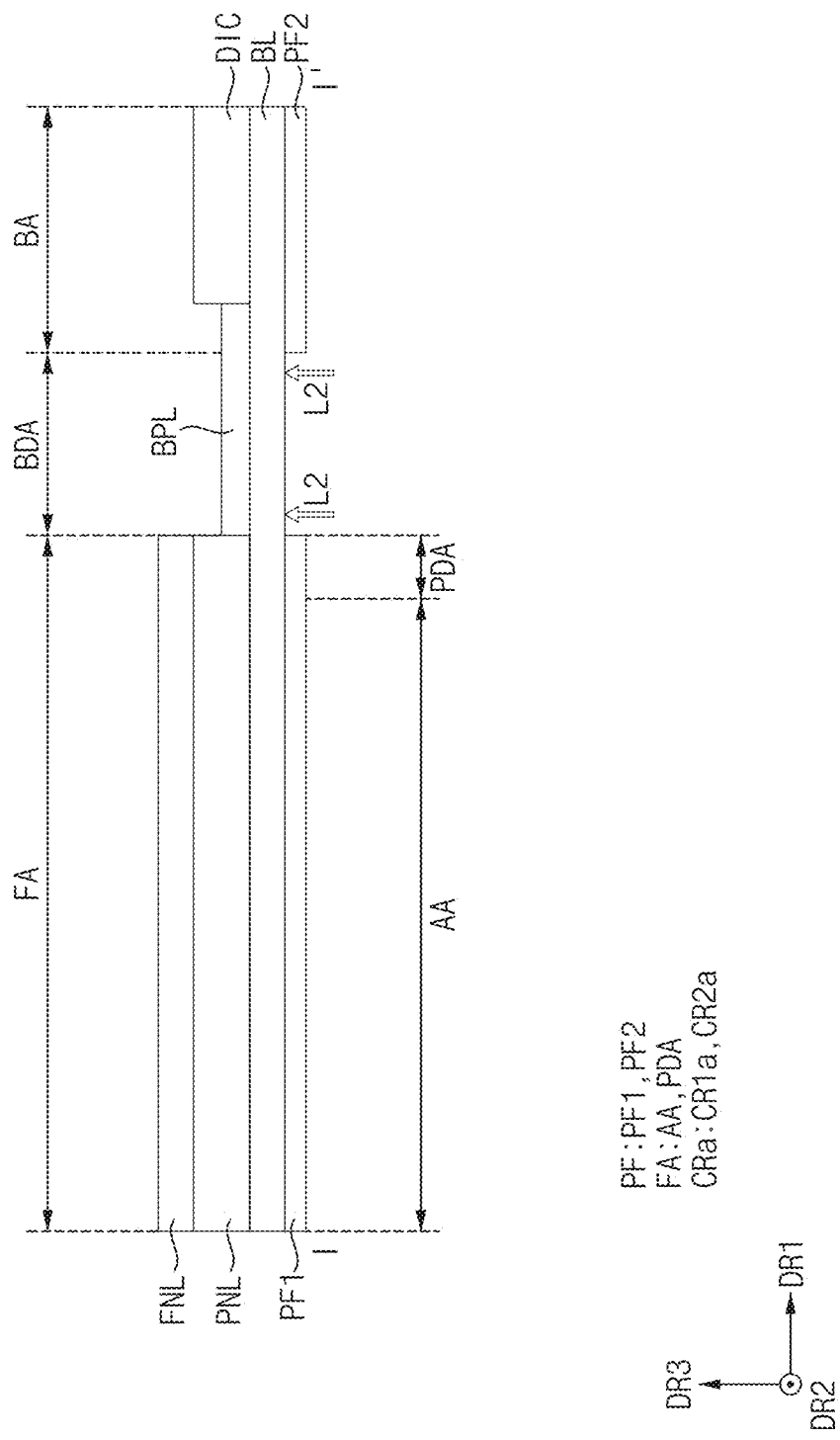
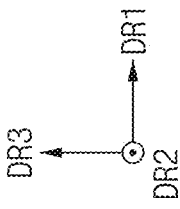

DISPLAY DEVICE

This application claims priority to Korean Patent Application No. 10-2023-0004989, filed on Jan. 12, 2023, and all the benefits accruing therefrom under 35 U.S.C. § 119, the content of which in its entirety is herein incorporated by reference.

BACKGROUND

1. Field

Embodiments of the disclosure relate to a display device.

2. Description of the Related Art

A display device may include a display panel configured to display an image, and a driver configured to generate a driving signal provided to a plurality of pixels included in the display panel. The display panel and the driver may be disposed on a base layer while the display panel and the driver are spaced apart from each other, and at least a portion of the base layer may be bent. As the portion of the base layer is bent, the driver may be disposed under the display panel.

SUMMARY

In the case that the portion of the base layer is bent and the driver is disposed under the display panel, a user of a display device who visually recognizes the image displayed on the display panel from a front surface of the display device may visually recognize a bottom bezel region defined by bending the portion of the base layer. As an area of the bottom bezel region increases, a size of the display device may be gradually increased, and convenience of the user of the display device may deteriorate.

A feature of the disclosure is to provide a display device in which an area of a bottom bezel region is reduced.

However, features of the disclosure are not limited to the above-described feature, and may be variously expanded without departing from the idea and scope of the disclosure.

In an embodiment of the disclosure, a display device may include abase layer defining a first recess in a first curve formation region, defining a second recess in a second curve formation region spaced apart from the first curve formation region, and including a flat region disposed between the first curve formation region and the second curve formation region, a display panel disposed on a first surface of the base layer in a front surface region that is adjacent to the first curve formation region of the base layer, a driver disposed on the first surface of the base layer in a rear surface region that is adjacent to the second curve formation region of the base layer, and a cover layer disposed between the display panel and the driver on the first surface of the base layer.

In an embodiment, each of the first and second recesses may be defined in a direction from a second surface of the base layer, which is opposite to the first surface of the base layer, toward the first surface of the base layer.

In an embodiment, each of the first and second recesses may not be defined through the base layer.

In an embodiment, each of thicknesses of the first and second recesses may be about 10% to about 50% of a thickness of the base layer in a cross-sectional view.

In an embodiment, a groove may be defined in the cover layer in a direction toward the first surface of the base layer in the flat region, and the groove may not be defined through the cover layer.

In an embodiment, the base layer may have a first radius of curvature in the first curve formation region in a cross-sectional view, and the base layer may have a second radius of curvature in the second curve formation region in the cross-sectional view.

In an embodiment, the first radius of curvature may be equal to the second radius of curvature.

In an embodiment, the display device may further include a first protective film attached to a second surface of the base layer, which is opposite to the first surface of the base layer, in the front surface region and a second protective film attached to the second surface of the base layer in the rear surface region.

In an embodiment, the first recess may be spaced apart from the first protective film, and the second recess may be spaced apart from the second protective film.

In an embodiment, a plurality of first recesses may be provided in the first curve formation region, and a plurality of second recesses may be provided in the second curve formation region.

In an embodiment of the disclosure, a display device may include a base layer including a front surface region and a rear surface region spaced apart from the front surface region, in which a thickness of the base layer in a first curve formation region that is adjacent to the front surface region is smaller than a thickness of the base layer in the front surface region in a cross-sectional view, and a thickness of the base layer in a second curve formation region that is adjacent to the rear surface region is smaller than a thickness of the base layer in the rear surface region in the cross-sectional view, and including a flat region disposed between the first curve formation region and the second curve formation region, a display panel disposed on a first surface of the base layer in the front surface region of the base layer, a driver disposed on the first surface of the base layer in the rear surface region of the base layer, and a cover layer disposed between the display panel and the driver on the first surface of the base layer.

In an embodiment, the first surface of the base layer may have a constant level.

In an embodiment, a groove may be defined in the cover layer in a direction toward the first surface of the base layer in the flat region, and the groove may not be defined through the cover layer.

In an embodiment, the thickness of the base layer in the first curve formation region may be equal to the thickness of the base layer in the second curve formation region in the cross-sectional view.

In an embodiment, the thickness of the base layer in the first curve formation region may be about 5% to about 40% of the thickness of the base layer in the front surface region in the cross-sectional view, and the thickness of the base layer in the second curve formation region may be about 5% to about 40% of the thickness of the base layer in the rear surface region in the cross-sectional view.

In an embodiment, the base layer may have a first radius of curvature in the first curve formation region in the cross-sectional view, and the base layer may have a second radius of curvature in the second curve formation region in the cross-sectional view.

In an embodiment, the first radius of curvature may be equal to the second radius of curvature.

In an embodiment, the display device may further include a first protective film attached to a second surface of the base layer, which is opposite to the first surface of the base layer, in the front surface region and a second protective film attached to the second surface of the base layer in the rear surface region.

Therefore, according to the disclosure, a display device may include: a base layer including a front surface region and a rear surface region spaced apart from the front surface region, defining a first recess in a first curve formation region that is adjacent to the front surface region between the front surface region and the rear surface region, and defining a second recess in a second curve formation region that is adjacent to the rear surface region and spaced apart from the first curve formation region between the front surface region and the rear surface region; a display panel disposed on a first surface of the base layer in the front surface region of the base layer; and a driver disposed on the first surface of the base layer in the rear surface region of the base layer.

Since the base layer includes the first curve formation region and the second curve formation region spaced apart from the first curve formation region, an area of a bottom bezel region defined at a bottom of the display device when viewing the display device from a front surface of the display device may be reduced.

In addition, since the base layer has the first recess and the second recess in the first curve formation region and the second curve formation region, respectively, when the base layer is bent in the first curve formation region and the second curve formation region, bending stress applied to the base layer may be relatively reduced.

In another embodiment of the disclosure, a display device may include: a base layer including a front surface region and a rear surface region spaced apart from the front surface region, in which a thickness of the base layer in a first curve formation region that is adjacent to the front surface region is smaller than a thickness of the base layer in the front surface region in a cross-sectional view, and a thickness of the base layer in a second curve formation region that is adjacent to the rear surface region is smaller than a thickness of the base layer in the rear surface region in the cross-sectional view; a display panel disposed on a first surface of the base layer in the front surface region of the base layer; and a driver disposed on the first surface of the base layer in the rear surface region of the base layer.

Since the base layer includes the first curve formation region and the second curve formation region spaced apart from the first curve formation region, an area of a bottom bezel region defined at a bottom of the display device when viewing the display device from a front surface of the display device may be reduced.

In addition, since the base layer has a relatively small thickness in the first curve formation region and the second curve formation region, when the base layer is bent in the first curve formation region and the second curve formation region, bending stress applied to the base layer may be relatively reduced.

However, effects of the disclosure are not limited to the above-described effects, and may be variously expanded without departing from the idea and scope of the disclosure.

BRIEF DESCRIPTION OF THE DRAWINGS

FIGS. 4 to 8 are views for describing a method for manufacturing the display device of FIG. 3.

DETAILED DESCRIPTION

Figure 1:
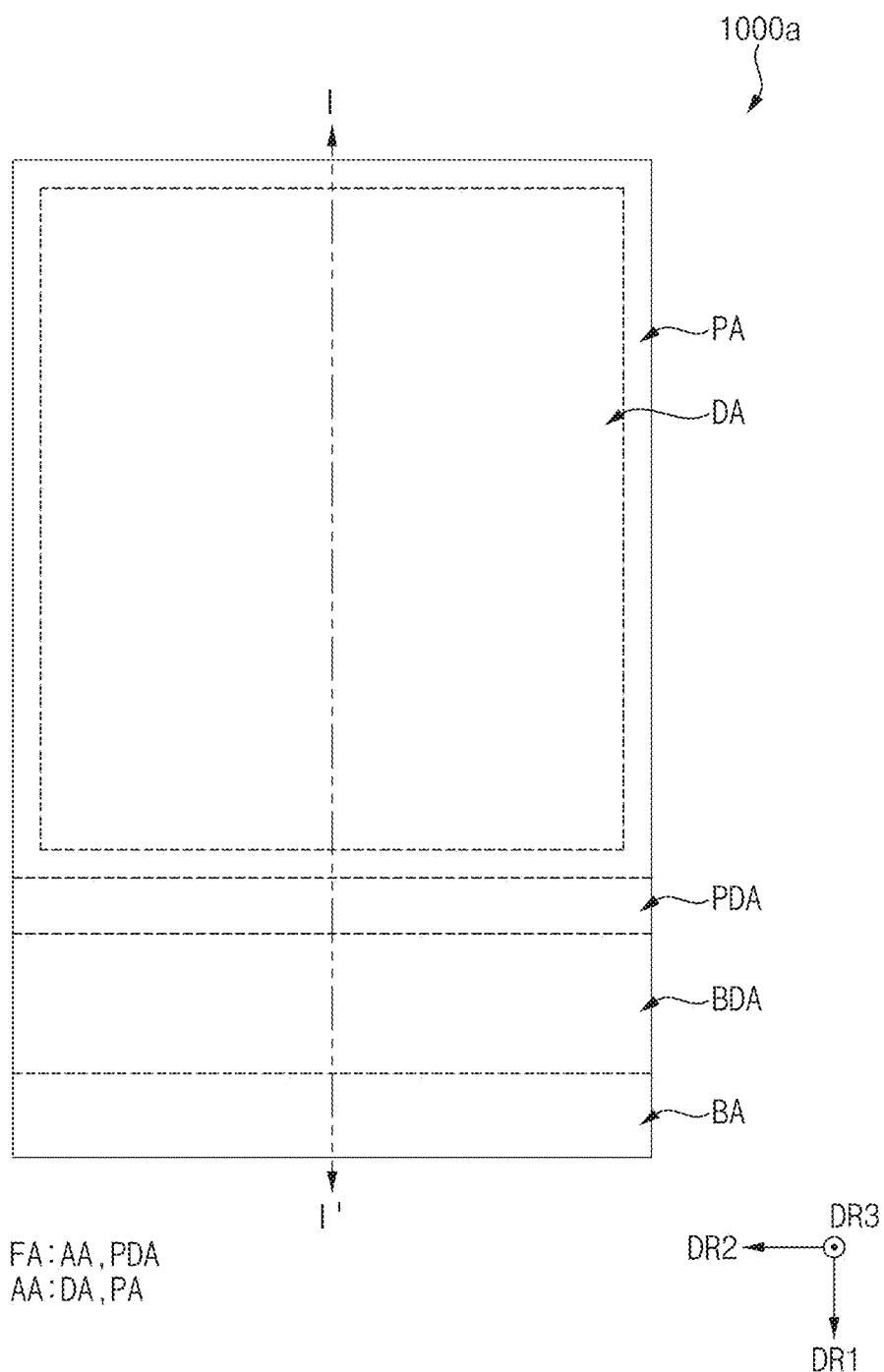
FIG. 1 is a plan view for describing an embodiment of a display device according to the disclosure.

Hereinafter, a display device in embodiments of the disclosure will be described in more detail with reference to the accompanying drawings. The same or similar reference numerals will be used for the same elements in the accompanying drawings.

It will be understood that when an element is referred to as being "on" another element, it can be directly on the other element or intervening elements may be present therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). The term such as "about" can mean within one or more standard deviations, or within ±30%, 20%, 10%, 5% of the stated value, for example.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

FIG. 1 is a plan view for describing an embodiment of a display device according to the disclosure.

Referring to FIG. 1, a display device 1000a may be partitioned into a plurality of regions. In more detail, the display device 1000a may include a front surface region FA, a rear surface region BA spaced apart from the front surface region FA in a first direction DR1, and a bending region BDA disposed between the front surface region FA and the rear surface region BA.

An image may be displayed on at least a portion of the front surface region FA. A user of the display device 1000a may visually recognize the image displayed on the portion of the front surface region FA.

In an embodiment, the front surface region FA may include an active region AA and a pad region PDA. In this case, the active region AA may include a display region DA and a peripheral region PA.

The display region DA may be a region in which the image is substantially displayed. To this end, a plurality of pixels configured to emit lights may be disposed in the display region DA. The pixels may be disposed over the whole display region DA. In an embodiment, the pixels may be arranged in the first direction DR1 and a second direction DR2 intersecting the first direction DR1 in the display region DA, for example.

The peripheral region PA may be disposed on at least one side of the display region DA. In an embodiment, as shown in FIG. 1, the peripheral region PA may surround the display region DA, for example. A driving circuit configured to drive the pixels disposed in the display region DA may be disposed in the peripheral region PA. In an embodiment, a scan driving circuit, a data driving circuit, a signal line, or the like may be disposed in the peripheral region PA, for example.

The pad region PDA may be disposed on at least one side of the peripheral region PA. A plurality of pad electrodes electrically connected to the driving circuit disposed in the peripheral region PA may be disposed in the pad region PDA.

Figure 3:
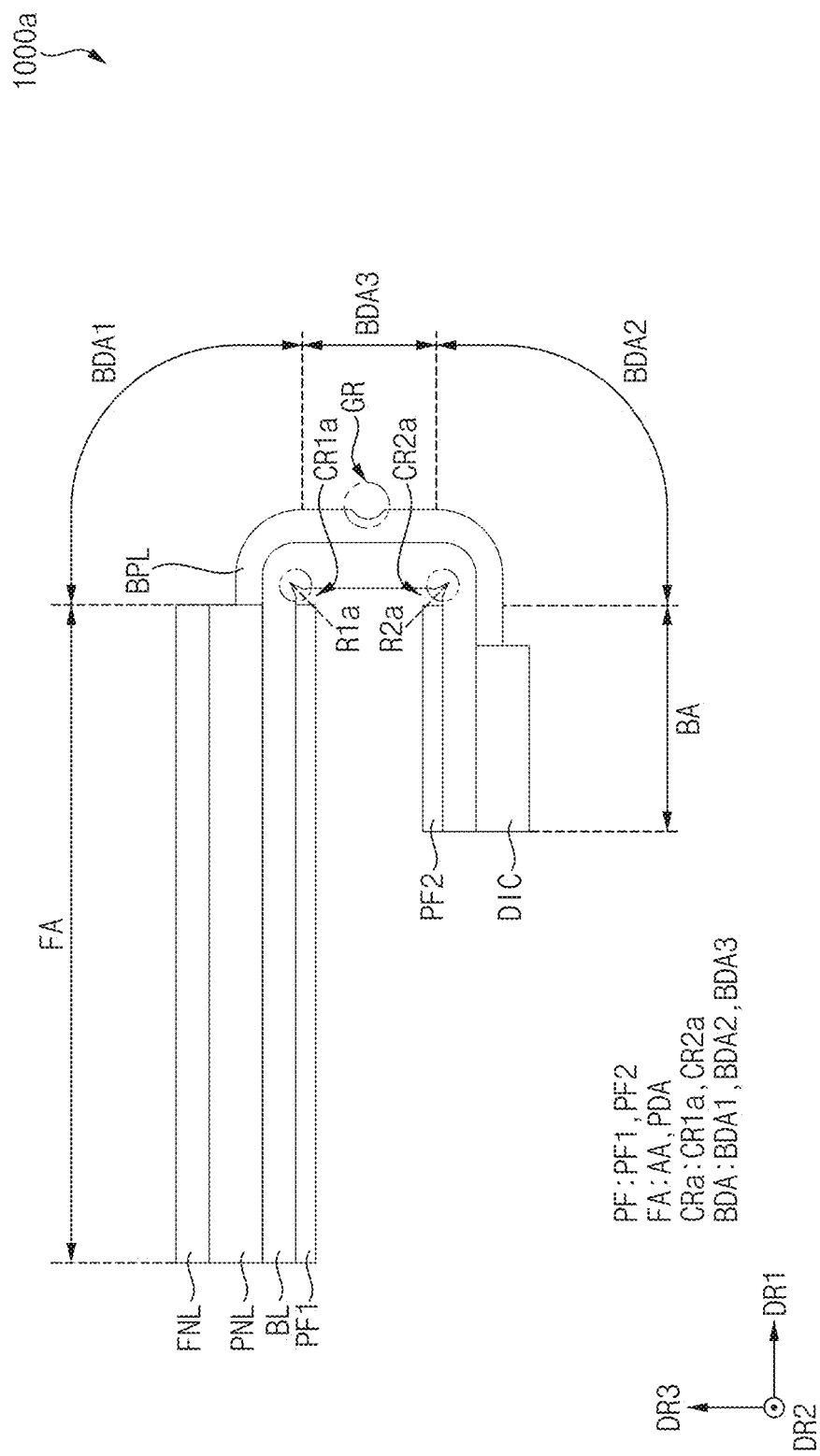
FIG. 3 is a cross-sectional view for describing a bent state of the display device of FIG. 1.

The bending region BDA may be disposed on at least one side of the pad region PDA. The bending region BDA may be a region in which the display device 1000a is bent. In more detail, although only an unbent state of the display device 1000a has been shown in FIG. 1 for convenience of description, the display device 1000a may be bent in the bending region BDA as shown in FIG. 3. When the display device 1000a is bent in the bending region BDA, the rear surface region BA may be disposed under the front surface region FA.

The rear surface region BA may be a region that is not substantially and visually recognized by the user of the display device 1000a. A driver (e.g., DIC of FIG. 2) configured to generate a driving signal may be disposed in the rear surface region BA.

The driving signal may be provided to the pad electrodes, so that the driving signal may be transmitted to the pixels electrically connected to the pad electrodes through the driving circuit. To this end, a plurality of transmission signal lines may be disposed in the bending region BDA. The transmission signal lines may electrically connect the pad electrodes to the driver.

As described above, as the display device 1000a is bent in the bending region BDA, when the user of the display device 1000a visually recognizes the image displayed on the portion of the front surface region FA, the rear surface region BA in which the driver is arranged may not be substantially and visually recognized by the user of the display device 1000a. Accordingly, an area of a bezel region defined as a region in which the image is not displayed in the display device 1000a may be relatively reduced.

In this case, a top bezel region of the display device 1000a may be defined by the peripheral region PA that is adjacent to a top of the display region DA. In addition, a bottom bezel region of the display device 1000a may be defined by the peripheral region PA, the pad region PDA, and the bending region BDA, which are adjacent to a bottom of the display region DA. An area of the bottom bezel region may be relatively larger than an area of the top bezel region.

In order to reduce the area of the bottom bezel region, an area of the peripheral region PA disposed at the bottom of the display device 1000a may be reduced, or an area of the pad region PDA disposed at the bottom of the display device 1000a may be reduced. However, in order to ensure a minimum area for arranging the driving circuit, the peripheral region PA disposed at the bottom of the display device 1000a has to have an area that is greater than or equal to a predetermined area. In addition, in order to ensure a minimum area for arranging the pad electrodes, the pad region PDA disposed at the bottom of the display device 1000a has to have an area that is greater than or equal to a predetermined area.

Therefore, in order to reduce the area of the bottom bezel region, an area of the bending region BDA when viewing the display device 1000a in a third direction DR3 that is perpendicular to the first and second directions DR1 and DR2 while the display device 1000a is bent has to be reduced.

Figure 2:
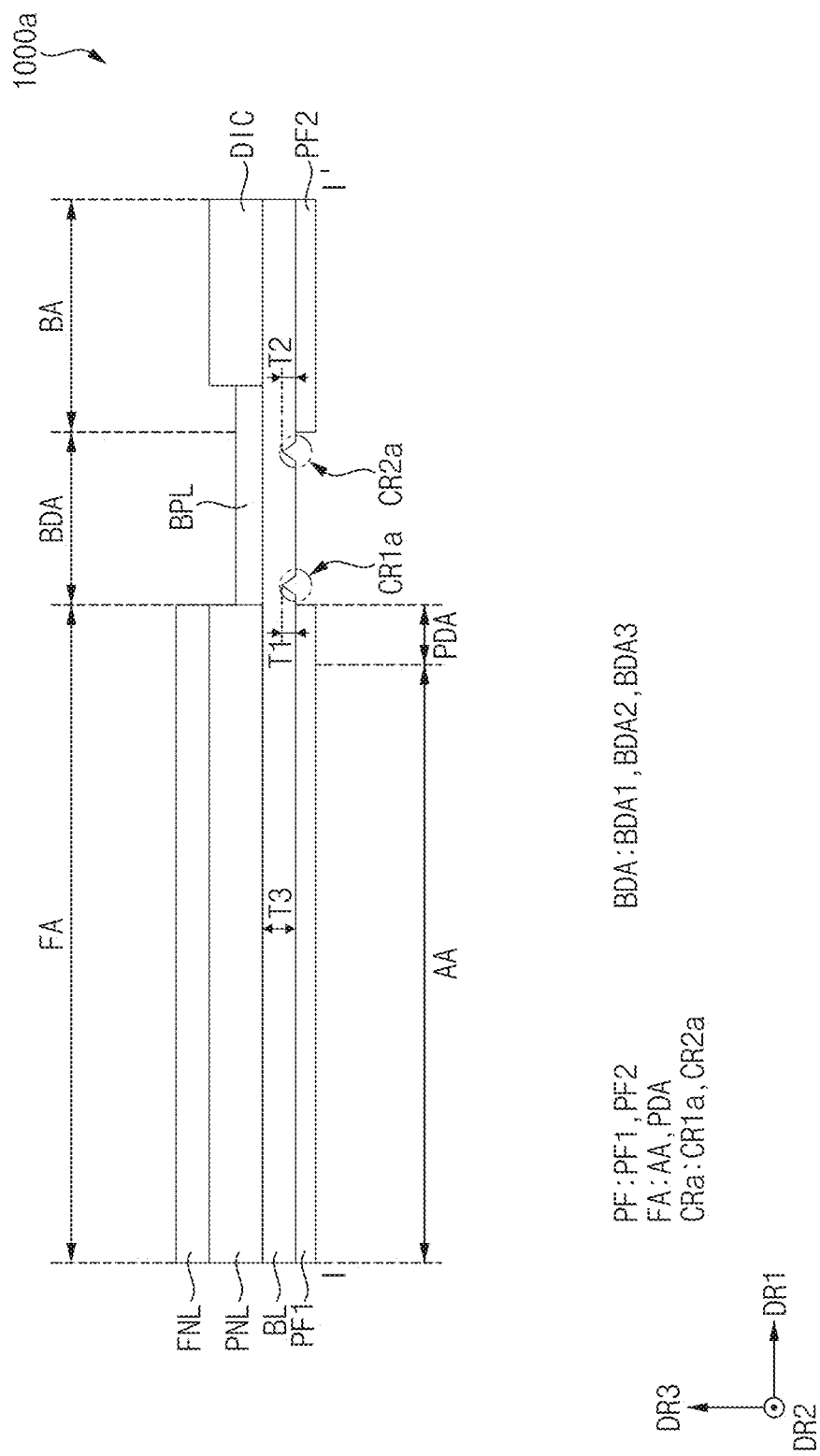
FIG. 2 is a cross-sectional view taken along line I-I' of FIG. 1.

FIG. 2 is a cross-sectional view taken along line I-I' of FIG. 1. FIG. 2 is a cross-sectional view assuming a state in which the display device 1000a of FIG. 1 is unbent without being bent.

Referring to FIG. 2, the display device 1000a may include a base layer BL, a display panel PNL, a functional layer FNL, a driver DIC, a cover layer BPL, and a protective film PF.

The base layer BL may overlap an entirety of the area of the front surface region FA, the bending region BDA, and the rear surface region BA. The base layer BL may serve to support the display panel PNL, the driver DIC, or the like. In addition, the base layer BL may be bent in the bending region BDA. In an embodiment, the base layer BL may include an organic insulating material.

The display panel PNL may be disposed on a first surface of the base layer BL (e.g., a top surface of the base layer BL) in the front surface region FA. The display panel PNL may include the pixels, the driving circuit, and the pad electrodes.

The functional layer FNL may be disposed on the display panel PNL in the front surface region FA. The functional layer FNL may include an encapsulation substrate, a polarization layer, a touch sensing layer, or the like.

The driver DIC may be disposed on the first surface of the base layer BL in the rear surface region BA. The driver DIC may generate the driving signal.

The cover layer BPL may be disposed between the display panel PNL and the driver DIC on the first surface of the base layer BL. In an embodiment, the transmission signal lines that electrically connect the driver DIC to the display panel PNL may be disposed on the base layer BL in the bending region BDA. In this case, the cover layer BPL may cover the base layer BL in the bending region BDA so as to cover the transmission signal lines. Accordingly, when the display device 1000a is bent in the bending region BDA, the transmission signal lines covered by the cover layer BPL may not be damaged by the bending. In an embodiment, the cover layer BPL may include an organic insulating material.

The protective film PF may include a first protective film PF1 and a second protective film PF2 spaced apart from the first protective film PF1.

The first protective film PF1 may be attached to a second surface of the base layer BL, which is opposite to the first surface of the base layer BL, in the front surface region FA, and the second protective film PF2 may be attached to the second surface of the base layer BL in the rear surface region BA. Each of the first and second protective films PF1 and PF2 may serve to protect the second surface of the base layer BL.

FIG. 3 is a cross-sectional view for describing a bent state of the display device of FIG. 1.

Referring to FIGS. 2 and 3, the display device 1000a may be bent in the bending region BDA. When the display device 1000a is bent, the bending region BDA may define a first curve formation region BDA1, a second curve formation region BDA2, and a flat region BDA3.

The first curve formation region BDA1 and the second curve formation region BDA2 may be regions in which the display device 1000a is bent to have a predetermined curvature. In this case, the first curve formation region BDA1 may be adjacent to the front surface region FA, and the second curve formation region BDA2 may be adjacent to the rear surface region BA while being spaced apart from the first curve formation region BDA1.

When the display device 1000a is bent, the base layer BL may have a first radius (e.g., R1a in FIG. 3) of curvature in the first curve formation region BDA1, and the base layer BL may have a second radius (e.g., R2a in FIG. 3) of curvature in the second curve formation region BDA2. In this case, in an embodiment, the first radius of curvature may be substantially equal to the second radius of curvature.

The flat region BDA3 may be disposed between the first curve formation region BDA1 and the second curve formation region BDA2. The display device 1000a may be substantially flat in the flat region BDA3. In other words, the display device 1000a may not be substantially bent in the flat region BDA3.

Since the display device 1000a is bent in the bending region BDA, and the bending region BDA defines the first curve formation region BDA1, the second curve formation region BDA2, and the flat region BDA3, the display device 1000a may be bent to have a relatively small radius of curvature in each of the first and second curve formation regions BDA1 and BDA2. Accordingly, the area of the bending region BDA when viewing the display device 1000a in the third direction DR3 that is perpendicular to the first and second directions DR1 and DR2 may be reduced.

Since the display device 1000a is bent to have a relatively small radius of curvature in each of the first and second curve formation regions BDA1 and BDA2, bending stress of the display device 1000a may be relatively increased in each of the first and second curve formation regions BDA1 and BDA2. When the bending stress is relatively increased, the display device 1000a may be damaged by the bending.

In order to prevent the damage, according to the disclosure, the base layer BL may define a first recess CR1a in the first curve formation region BDA1, and define a second recess CR2a in the second curve formation region BDA2. Each of the first and second recesses CR1a and CR2a may be defined in a direction from the second surface of the base layer BL toward the first surface of the base layer BL, the first recess CR1a may be spaced apart from the first protective film PF1, and the second recess CR2a may be spaced apart from the second protective film PF2. Since the base layer BL defines the first recess CR1a and the second recess CR2a, bending stress caused by the bending of the base layer BL may be relatively reduced in each of the first and second curve formation regions BDA1 and BDA2.

Each of the first and second recesses CR1a and CR2a may extend in the second direction DR2. Each of the first and second recesses CR1a and CR2a may not be defined through the base layer BL. When each of the first and second recesses CR1a and CR2a is defined through the base layer BL, the transmission signal lines disposed on the base layer BL may be exposed, so that the transmission signal lines may be damaged by external moisture and impurities.

In an embodiment, each of a thickness of the first recess CR1a in a cross-sectional view (e.g., a thickness T1 of the first recess CR1a in the third direction DR3 as shown in FIG. 2) and a thickness of the second recess CR2a in a cross-sectional view (e.g., a thickness T2 of the second recess CR2a in the third direction DR3 as shown in FIG. 2) may be about 10% to about 50% of a thickness of the base layer BL in a cross-sectional view (e.g., a thickness T3 of the base layer BL in the third direction DR3 as shown in FIG. 2).

When each of the thicknesses of the first and second recesses CR1a and CR2a is less than about 10% of the thickness of the base layer BL in a cross-sectional view, the first recess CR1a and the second recess CR2a may not sufficiently alleviate the bending stress caused by the bending of the base layer BL in each of the first and second curve formation regions BDA1 and BDA2, so that the base layer BL may be damaged by the bending.

When each of the thicknesses of the first and second recesses CR1a and CR2a is greater than about 50% of the thickness of the base layer BL in a cross-sectional view, external moisture and impurities may be introduced through the first recess CR1a and the second recess CR2a, so that the transmission signal lines disposed on the base layer BL may be damaged.

Although an embodiment in which the base layer BL defines one first recess CR1a and one second recess CR2a has been described in FIGS. 2 and 3, the disclosure is not limited thereto. In an embodiment, the base layer BL may define a plurality of first recesses in the first curve formation region BDA1, for example. In addition, In another embodiment, the base layer BL may define a plurality of second recesses in the second curve formation region BDA2.

In an embodiment, as shown in FIG. 3, a groove GR may be defined in the cover layer BPL in a direction toward the first surface of the base layer BL. In this case, the groove GR may not be defined through the cover layer BPL. The groove GR may be defined by pressing the cover layer BPL disposed in the flat region BDA3 in a direction opposite to the first direction DR1 in a process of bending the display device 1000a. In this case, since the cover layer BPL disposed on the flat region BDA3 is pressed in the direction opposite to the first direction DR1, the area of the bottom bezel region of the display device 1000a may be further reduced.

FIGS. 4 to 8 are views for describing a method for manufacturing the display device of FIG. 3.

Figure 4:
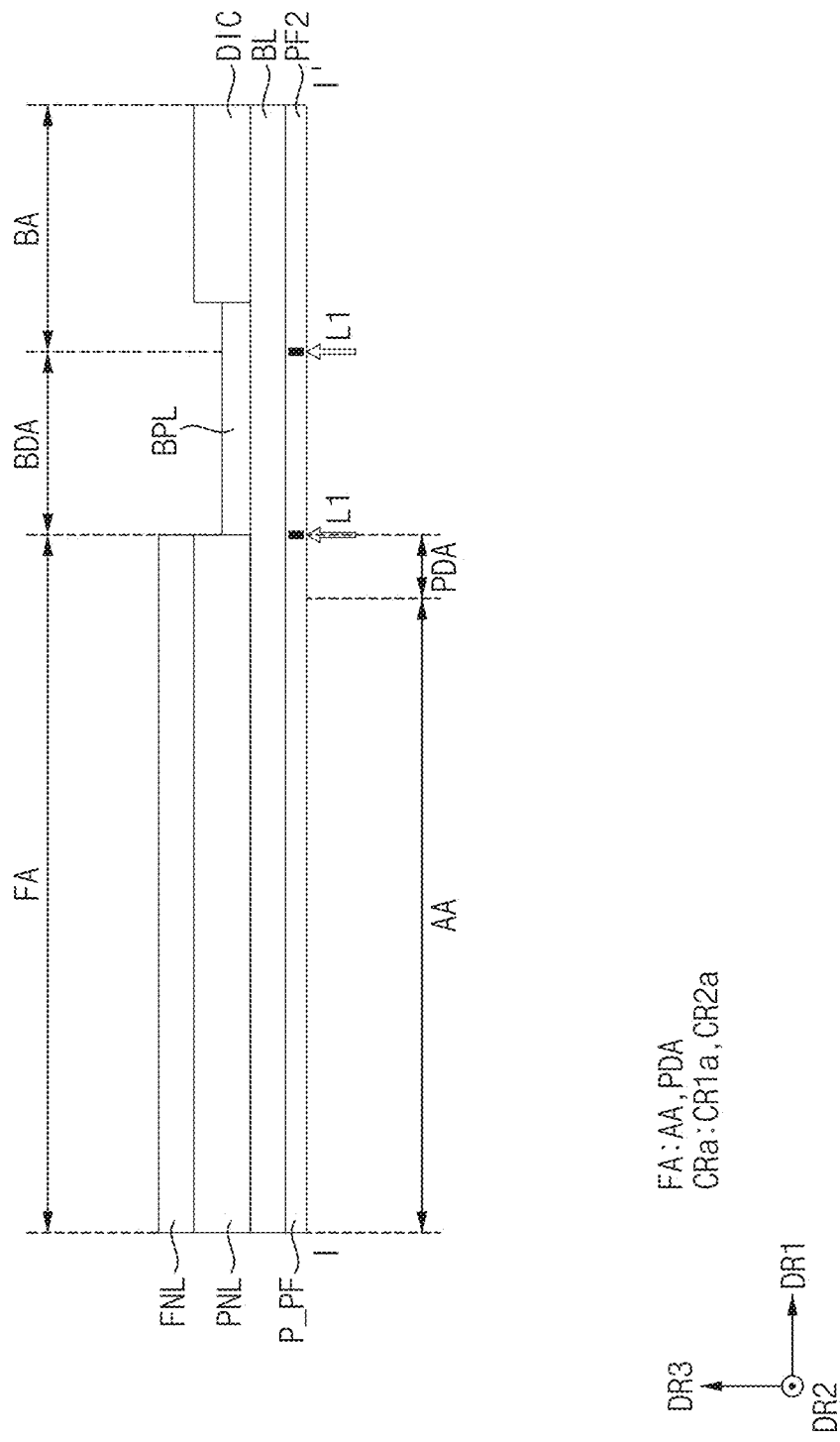

Referring to FIG. 4, the display panel PNL, the functional layer FNL, the cover layer BPL, and the driver DIC may be formed on the base layer BL. Methods for forming the display panel PNL, the functional layer FNL, the cover layer BPL, and the driver DIC are not limited, and various known methods may be used.

Thereafter, a preliminary protective film P_PF may be attached to the second surface of the base layer BL, and a first laser L1 may be radiated along a boundary between the bending region BDA and the front surface region FA and a boundary between the bending region BDA and the rear surface region BA. The first laser L1 may be radiated in a direction toward a bottom surface of the preliminary protective film P_PF (e.g., in the third direction DR3).

In this case, the first laser L1 may not be substantially radiated to the base layer BL. In other words, the base layer BL may not be damaged by the first laser L1. To this end, the first laser L1 may have a wavelength (or intensity) that does not damage the base layer BL.

Referring to FIG. 5, after the first laser L1 is radiated, the first protective film PF1 and the second protective film PF2 may be formed by removing the preliminary protective film P_PF overlapping the bending region BDA. In this case, the protective film PF may not be attached to the second surface of the base layer BL overlapping the bending region BDA. In other words, the second surface of the base layer BL overlapping the bending region BDA may be exposed.

Figure 6:
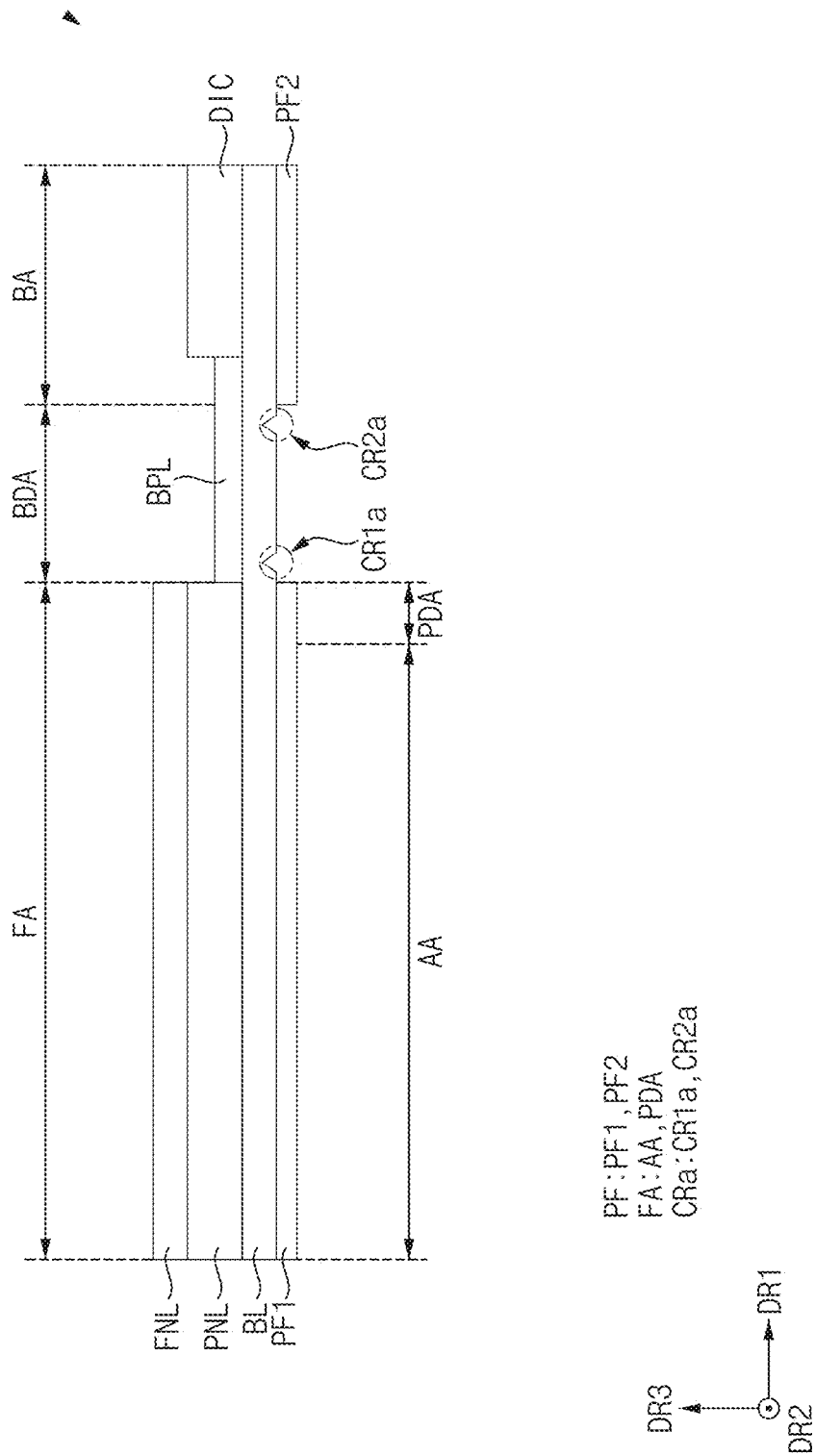

Referring to FIGS. 5 and 6, a second laser L2 may be radiated to the second surface of the base layer BL overlapping the bending region BDA. The second laser L2 may be radiated in the third direction DR3. The second laser L2 may serve to apply a physical damage to the second surface of the base layer BL at a relatively low thickness level. Accordingly, the first recess CR1a and the second recess CR2a may be defined by the second laser L2.

Figure 7:
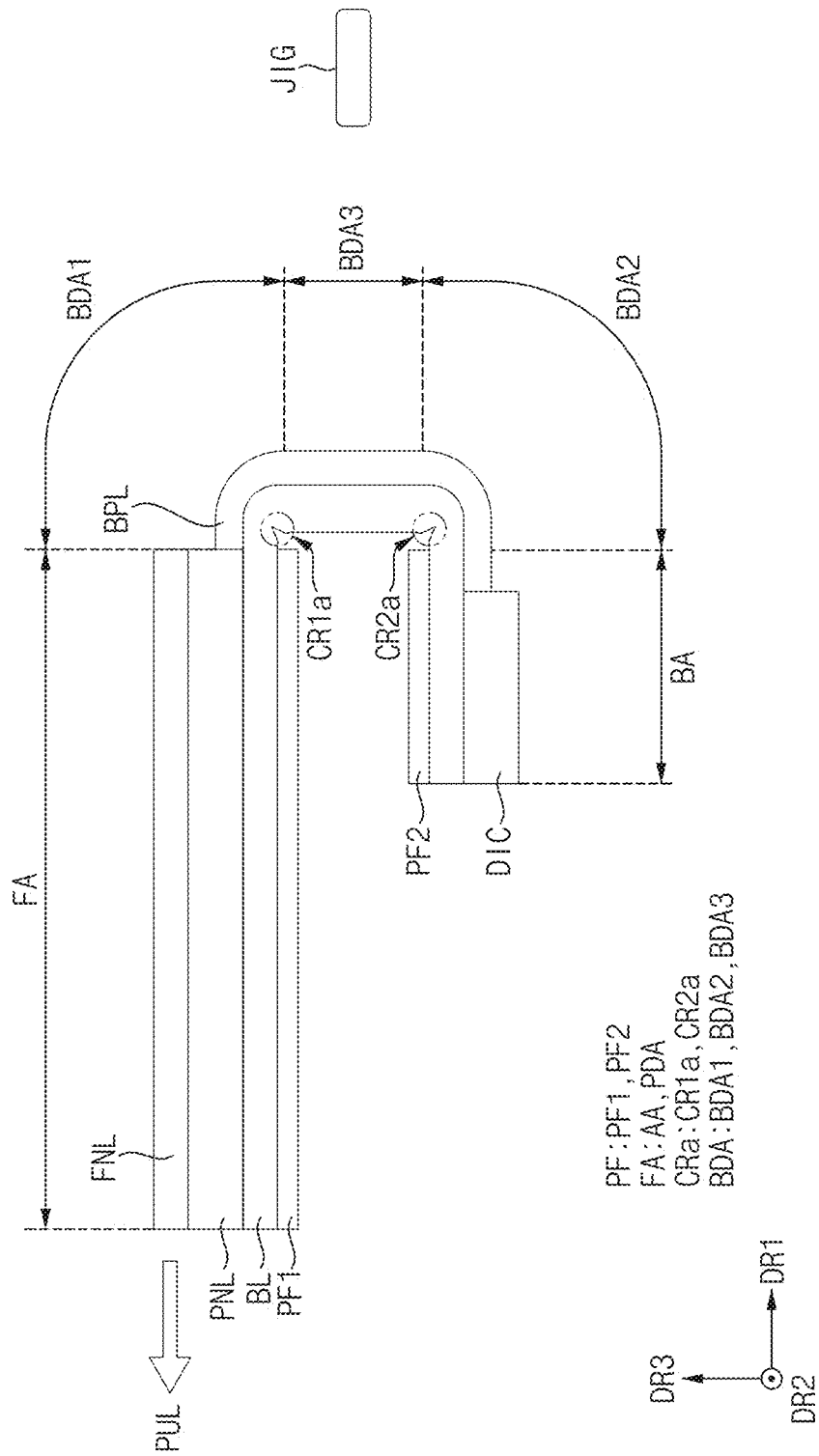
Figure 8:
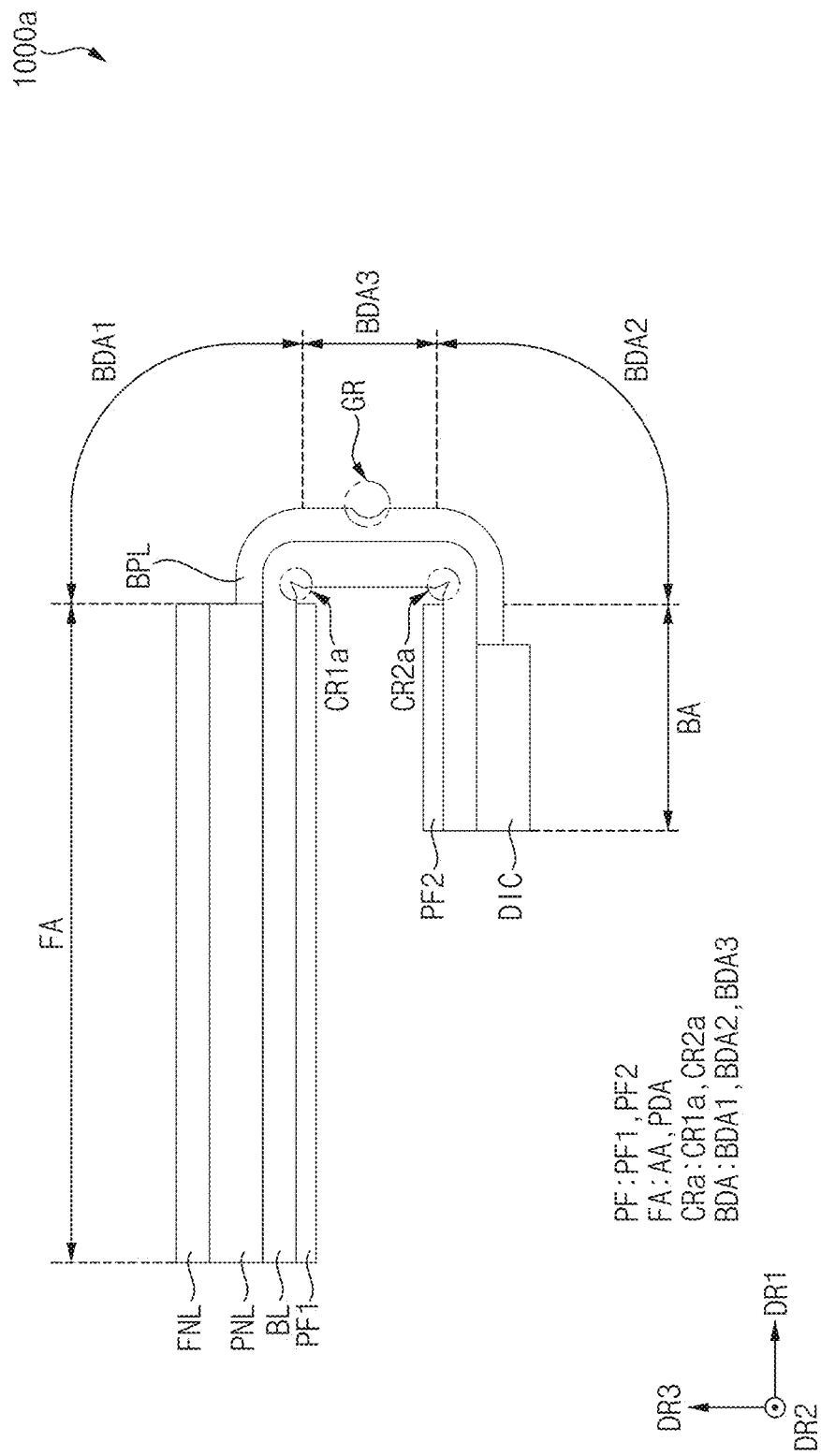

Referring to FIGS. 7 and 8, the base layer BL and the cover layer BPL may be bent in the bending region BDA.

In a process of bending the base layer BL and the cover layer BPL, while the functional layer FNL, the display panel PNL, the base layer BL, and the first protective film PF1, which are disposed on the front surface region FA, may be pulled (PUL) in the direction opposite to the first direction DR1, the cover layer BPL may be pressed in the direction opposite to the first direction DR1 by a jig JIG in the flat region BDA3. Accordingly, the groove GR, which is a trace defined by the pressing of the jig JIG, may be defined in the cover layer BPL, and the area of the bottom bezel region of the display device 1000a may be further reduced.

Figure 9:
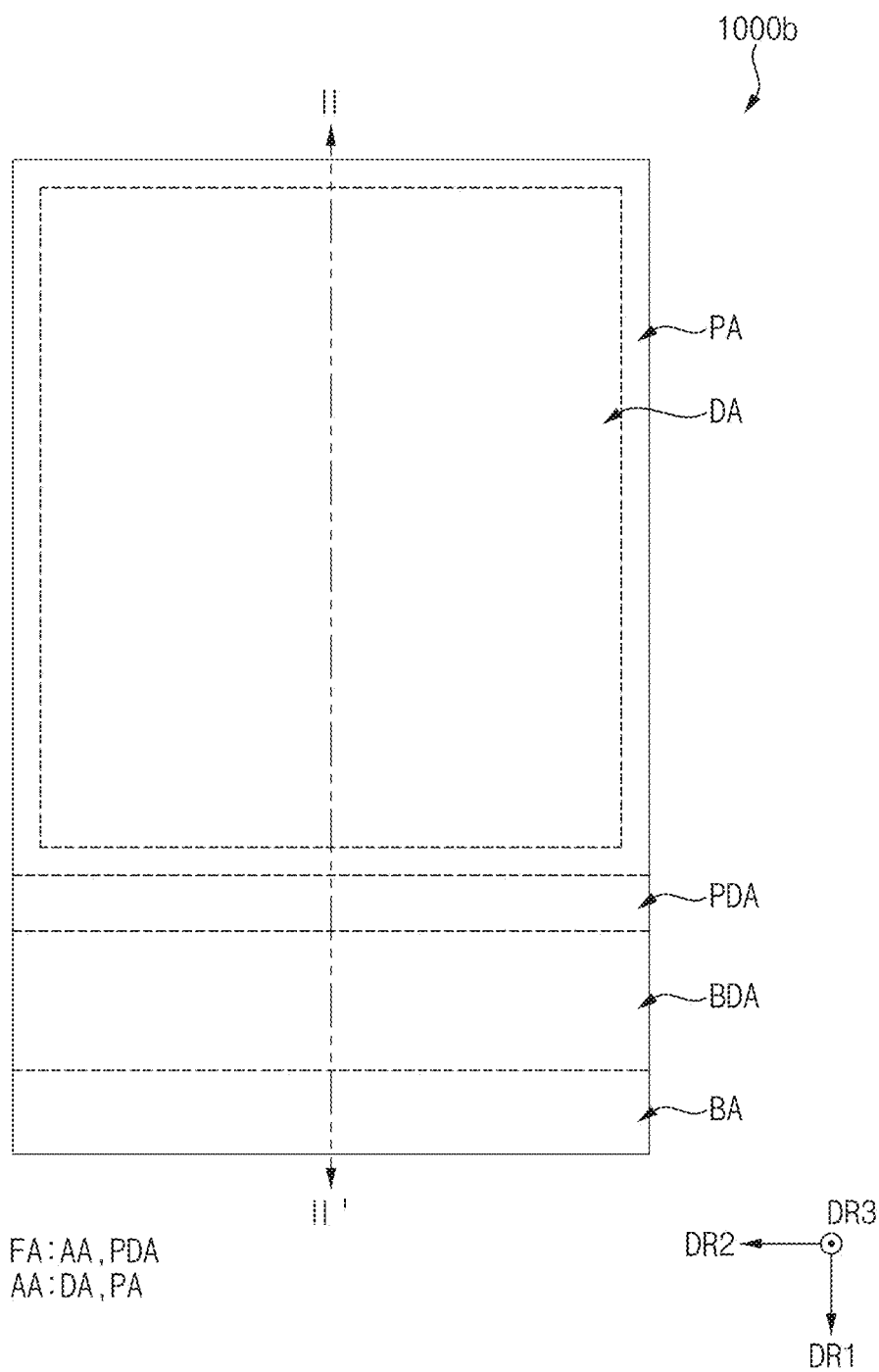
FIG. 9 is a plan view for describing another embodiment of a display device according to the disclosure.

FIG. 9 is a plan view for describing another embodiment of a display device according to the disclosure. Redundant descriptions of configurations that are substantially identical (or similar) to the configurations described with reference to FIG. 1 may be omitted.

Referring to FIG. 9, a display device 1000b may be partitioned into a plurality of regions. In more detail, the display device 1000b may include a front surface region FA, a rear surface region BA spaced apart from the front surface region FA in a first direction DR1, and a bending region BDA disposed between the front surface region FA and the rear surface region BA.

In an embodiment, the front surface region FA may include an active region AA and a pad region PDA. In this case, the active region AA may include a display region DA and a peripheral region PA.

Figure 10:
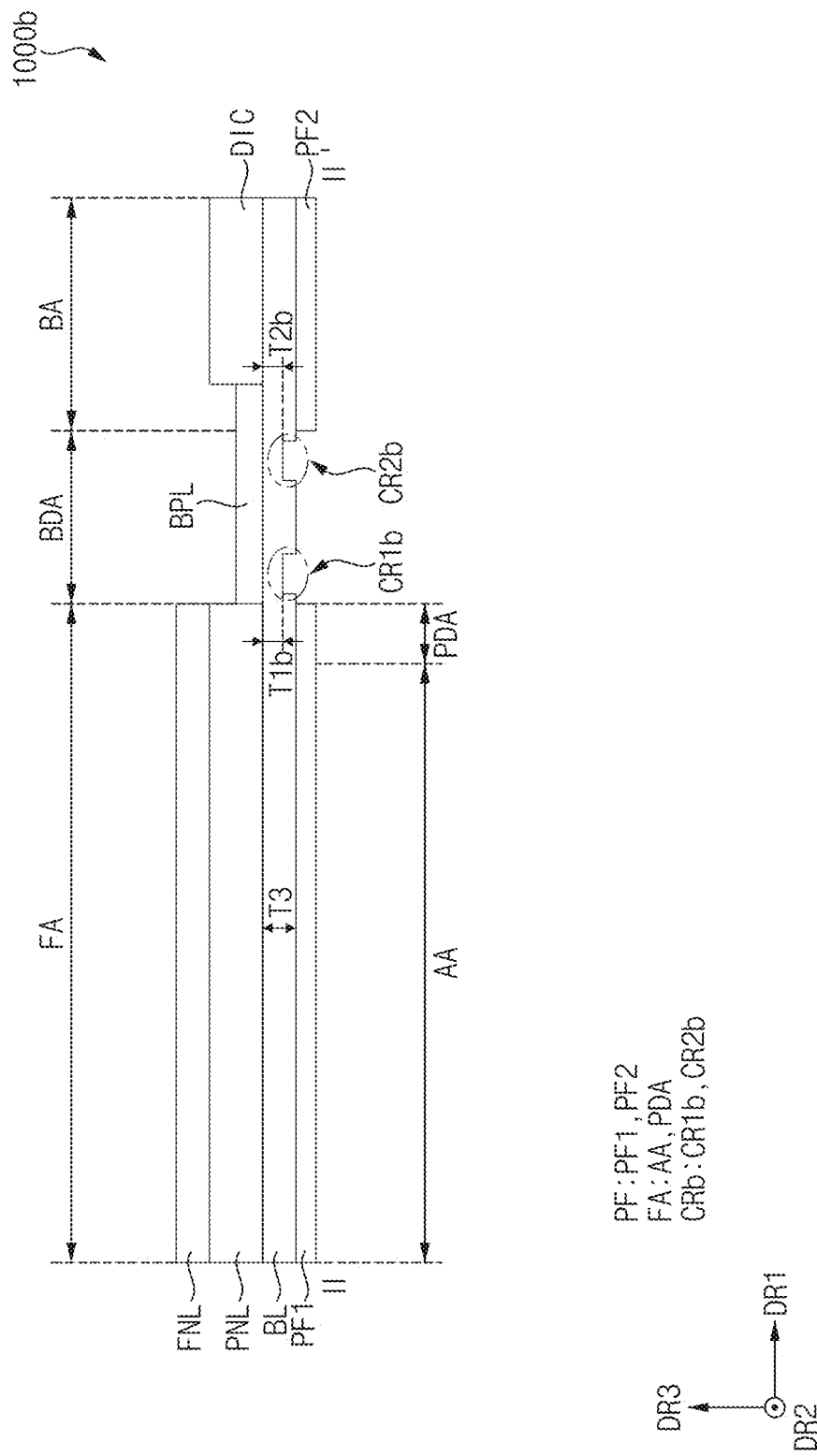
FIG. 10 is a cross-sectional view taken along line II-II' of FIG. 9.

FIG. 10 is a cross-sectional view taken along line II-II' of FIG. 9. FIG. 10 is a cross-sectional view assuming a state in which the display device 1000b of FIG. 9 is unbent without being bent.

Referring to FIG. 10, the display device 1000b may include a base layer BL, a display panel PNL, a functional layer FNL, a driver DIC, a cover layer BPL, and a protective film PF.

The base layer BL may overlap an entirety of the area of the front surface region FA, the bending region BDA, and the rear surface region BA. The base layer BL may serve to support the display panel PNL, the driver DIC, or the like. In addition, the base layer BL may be bent in the bending region BDA. In an embodiment, the base layer BL may include an organic insulating material.

The display panel PNL may be disposed on a first surface of the base layer BL (e.g., a top surface of the base layer BL) in the front surface region FA. The display panel PNL may include the pixels, the driving circuit, and the pad electrodes.

The functional layer FNL may be disposed on the display panel PNL in the front surface region FA. The functional layer FNL may include an encapsulation substrate, a polarization layer, a touch sensing layer, or the like.

The driver DIC may be disposed on the first surface of the base layer BL in the rear surface region BA. The driver DIC may generate the driving signal.

The cover layer BPL may be disposed between the display panel PNL and the driver DIC on the first surface of the base layer BL. In an embodiment, the transmission signal lines that electrically connect the driver DIC to the display panel PNL may be disposed on the base layer BL in the bending region BDA. In this case, the cover layer BPL may cover the base layer BL in the bending region BDA so as to cover the transmission signal lines. Accordingly, when the display device 1000b is bent in the bending region BDA, the transmission signal lines covered by the cover layer BPL may not be damaged by the bending. In an embodiment, the cover layer BPL may include an organic insulating material.

The protective film PF may include a first protective film PF1 and a second protective film PF2 spaced apart from the first protective film PF1.

The first protective film PF1 may be attached to a second surface of the base layer BL, which is opposite to the first surface of the base layer BL, in the front surface region FA, and the second protective film PF2 may be attached to the second surface of the base layer BL in the rear surface region BA. Each of the first and second protective films PF1 and PF2 may serve to protect the second surface of the base layer BL.

Figure 11:
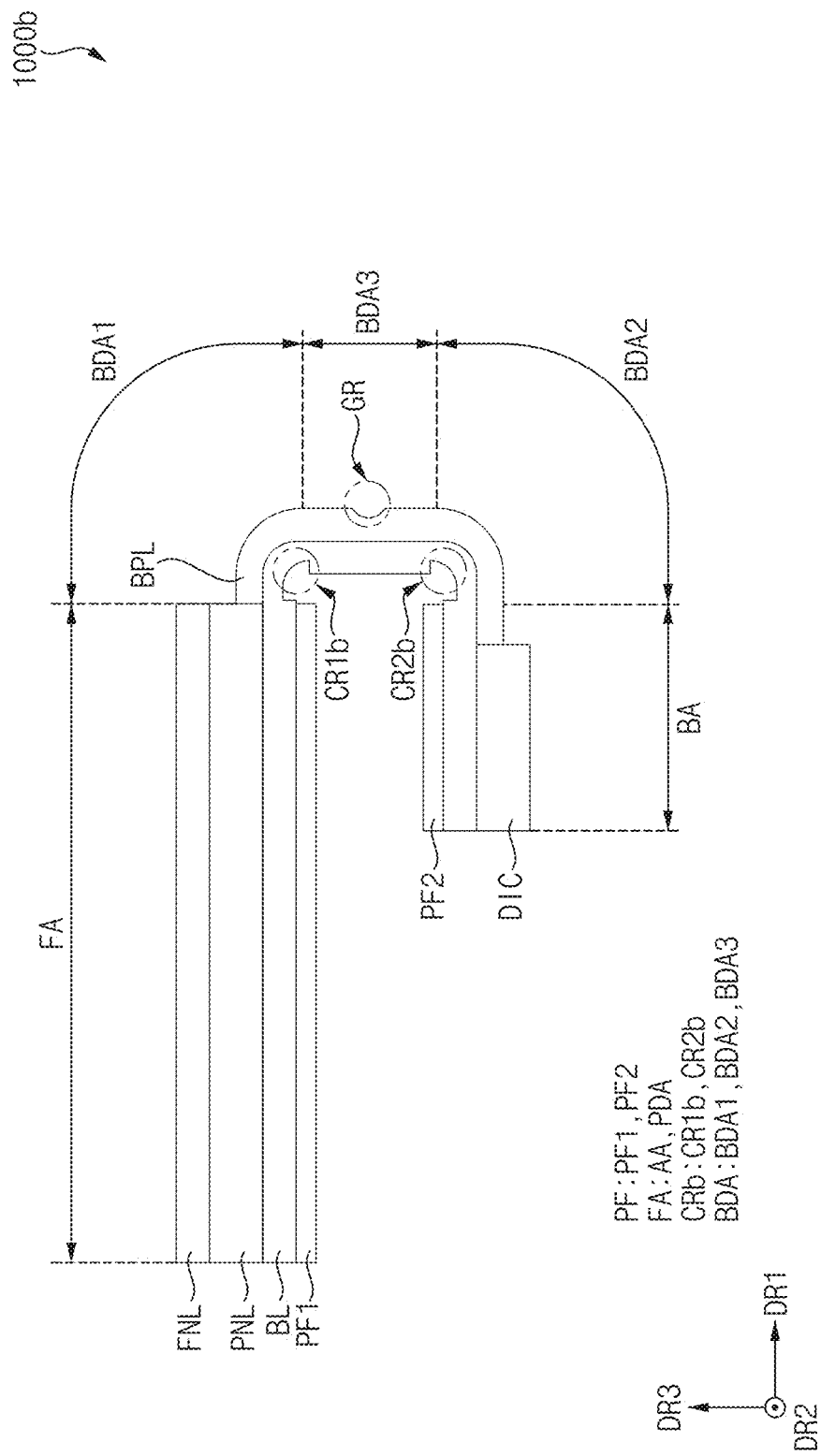
FIG. 11 is a cross-sectional view for describing a bent state of the display device of FIG. 10.

FIG. 11 is a cross-sectional view for describing a bent state of the display device of FIG. 10.

Referring to FIGS. 10 and 11, the display device 1000b may be bent in the bending region BDA. When the display device 1000b is bent, the bending region BDA may define a first curve formation region BDA1, a second curve formation region BDA2, and a flat region BDA3.

The first curve formation region BDA1 and the second curve formation region BDA2 may be regions in which the display device 1000b is bent to have a predetermined curvature. In this case, the first curve formation region BDA1 may be adjacent to the front surface region FA, and the second curve formation region BDA2 may be adjacent to the rear surface region BA while being spaced apart from the first curve formation region BDA1.

When the display device 1000b is bent, the base layer BL may have a first radius of curvature in the first curve formation region BDA1, and the base layer BL may have a second radius of curvature in the second curve formation region BDA2. In this case, in an embodiment, the first radius of curvature may be substantially equal to the second radius of curvature.

The flat region BDA3 may be disposed between the first curve formation region BDA1 and the second curve formation region BDA2. The display device 1000b may be substantially flat in the flat region BDA3. In other words, the display device 1000b may not be substantially bent in the flat region BDA3.

Since the display device 1000b is bent in the bending region BDA, and the bending region BDA defines the first curve formation region BDA1, the second curve formation region BDA2, and the flat region BDA3, the display device 1000b may be bent to have a relatively small radius of curvature in each of the first and second curve formation regions BDA1 and BDA2. Accordingly, the area of the bending region BDA when viewing the display device 1000b in the third direction DR3 that is perpendicular to the first and second directions DR1 and DR2 may be reduced.

Since the display device 1000b is bent to have a relatively small radius of curvature in each of the first and second curve formation regions BDA1 and BDA2, bending stress of the display device 1000b may be relatively increased in each of the first and second curve formation regions BDA1 and BDA2. When the bending stress is relatively increased, the display device 1000b may be damaged by the bending.

In order to prevent the damage, according to the disclosure, the base layer BL may define a first thickness reduction part CR1b in the first curve formation region BDA1, and define a second thickness reduction part CR2b in the second curve formation region BDA2.

The first thickness reduction part CR1b may be formed to correspond to the entirety of the first curve formation region BDA1. In addition, the second thickness reduction part CR2b may be formed to correspond to the entirety of the second curve formation region BDA2.

As shown in FIG. 10, the first thickness reduction part CR1b may allow the base layer BL to have a relatively small thickness (e.g., a thickness T1b in the third direction DR3 in FIG. 10). In addition, the second thickness reduction part CR2b may allow the base layer BL to have a relatively small thickness (e.g., a thickness T2b in the third direction DR3 in FIG. 10). In this case, as shown in FIG. 10, the first surface of the base layer BL may have a substantially constant level.

In an embodiment, a thickness of the base layer BL in the first curve formation region BDA1 may be substantially equal to a thickness of the base layer BL in the second curve formation region BDA2. Accordingly, the bending stress caused by the bending of the base layer BL may be relatively reduced in each of the first and second curve formation regions BDA1 and BDA2.

In an embodiment, the thickness of the base layer BL in the first curve formation region BDA1 may be about 5% to about 40% of a thickness (e.g., T3 in the third direction DR3 in FIG. 10) of the base layer BL in the front surface region FA.

When the thickness of the base layer BL in the first curve formation region BDA1 is less than about 5% of the thickness of the base layer BL in the front surface region FA, the bending stress caused by the bending of the base layer BL may not be sufficiently alleviated in the first curve formation region BDA1, so that the base layer BL may be damaged by the bending.

When the thickness of the base layer BL in the first curve formation region BDA1 is greater than about 40% of the thickness of the base layer BL in the front surface region FA, the transmission signal lines disposed on the base layer BL may be damaged by moisture and impurities introduced from an outside.

Similarly, in an embodiment, the thickness of the base layer BL in the second curve formation region BDA2 may be about 5% to about 40% of a thickness of the base layer BL in the rear surface region BA.

In an embodiment, as shown in FIG. 11, a groove GR may be defined in the cover layer BPL in a direction toward the first surface of the base layer BL. In this case, the groove GR may not be defined through the cover layer BPL. The groove GR may be defined by pressing the cover layer BPL disposed in the flat region BDA3 in a direction opposite to the first direction DR1 in a process of bending the display device 1000b. In this case, since the cover layer BPL disposed on the flat region BDA3 is pressed in the direction opposite to the first direction DR1, the area of the bottom bezel region of the display device 1000b may be further reduced.

Although embodiments of the disclosure have been described above, it will be understood by those of ordinary skill in the art that various changes and modifications may be made to the disclosure without departing from the idea and scope of the disclosure as set forth in the appended claims.

What is claimed is:

1. A display device comprising:
    a base layer defining a first recess in a first curve formation region, defining a second recess in a second curve formation region spaced apart from the first curve formation region, and including a flat region disposed between the first curve formation region and the second curve formation region;
    a display panel disposed on a first surface of the base layer in a front surface region which is adjacent to the first curve formation region of the base layer;
    a driver disposed on the first surface of the base layer in a rear surface region which is adjacent to the second curve formation region of the base layer; and
    a cover layer disposed between the display panel and the driver on the first surface of the base layer.

2. The display device of claim 1, wherein each of the first and second recesses is defined in a direction from a second surface of the base layer, which is opposite to the first surface of the base layer, toward the first surface of the base layer.

3. The display device of claim 2, wherein each of the first and second recesses is not defined through the base layer.

4. The display device of claim 3, wherein each of thicknesses of the first and second recesses is about 10% to about 50% of a thickness of the base layer in a cross-sectional view.

5. The display device of claim 1, wherein a groove is defined in the cover layer in a direction toward the first surface of the base layer in the flat region, and
    the groove is not defined through the cover layer.

6. The display device of claim 1, wherein the base layer has a first radius of curvature in the first curve formation region in a cross-sectional view, and the base layer has a second radius of curvature in the second curve formation region in the cross-sectional view.

7. The display device of claim 6, wherein the first radius of curvature is equal to the second radius of curvature.

8. The display device of claim 1, further comprising:
a first protective film attached to a second surface of the base layer, which is opposite to the first surface of the base layer, in the front surface region; and
a second protective film attached to the second surface of the base layer in the rear surface region.

9. The display device of claim 8, wherein the first recess is spaced apart from the first protective film, and
the second recess is spaced apart from the second protective film.

10. The display device of claim 1, wherein a plurality of first recesses is provided in the first curve formation region, and
a plurality of second recesses is provided in the second curve formation region.

11. A display device comprising:
a base layer including a front surface region and a rear surface region spaced apart from the front surface region, in which a thickness of the base layer in a first curve formation region which is adjacent to the front surface region is smaller than a thickness of the base layer in the front surface region in a cross-sectional view, and a thickness of the base layer in a second curve formation region which is adjacent to the rear surface region is smaller than a thickness of the base layer in the rear surface region in the cross-sectional view, and including a flat region disposed between the first curve formation region and the second curve formation region;
a display panel disposed on a first surface of the base layer in the front surface region of the base layer;
a driver disposed on the first surface of the base layer in the rear surface region of the base layer; and
a cover layer disposed between the display panel and the driver on the first surface of the base layer.

12. The display device of claim 11, wherein the first surface of the base layer has a constant level.

13. The display device of claim 11, wherein a groove is defined in the cover layer in a direction toward the first surface of the base layer in the flat region, and
the groove is not defined through the cover layer.

14. The display device of claim 11, wherein the thickness of the base layer in the first curve formation region is equal to the thickness of the base layer in the second curve formation region in the cross-sectional view.

15. The display device of claim 11, wherein the thickness of the base layer in the first curve formation region is about 5% to about 40% of the thickness of the base layer in the front surface region in the cross-sectional view, and
the thickness of the base layer in the second curve formation region is about 5% to about 40% of the thickness of the base layer in the rear surface region in the cross-sectional view.

16. The display device of claim 11, wherein the base layer has a first radius of curvature in the first curve formation region in the cross-sectional view, and
the base layer has a second radius of curvature in the second curve formation region in the cross-sectional view.

17. The display device of claim 16, wherein the first radius of curvature is equal to the second radius of curvature.

18. The display device of claim 11, further comprising:
a first protective film attached to a second surface of the base layer, which is opposite to the first surface of the base layer, in the front surface region; and
a second protective film attached to the second surface of the base layer in the rear surface region.

* * * * *